United States Patent [19]

Pankove

[11] 3,864,592

[45] Feb. 4, 1975

[54] ELECTROLUMINESCENT SEMICONDUCTOR DISPLAY

[75] Inventor: Jacques Isaac Pankove, Princeton, N.J.

[73] Assignee: RCA Corporation, New York, N.Y.

[22] Filed: Mar. 22, 1973

[21] Appl. No.: 343,736

[52] U.S. Cl. .................................. 313/503, 313/510

[51] Int. Cl. .................................. H05b 33/14

[58] Field of Search ............ 313/108 D, 109.5, 510, 313/503

[56] References Cited

UNITED STATES PATENTS 3,330,983 7/1967 Cusano et al. .................. 313/108 D

FOREIGN PATENTS OR APPLICATIONS 1,817,307 8/1969 Germany ........................ 313/108 D

OTHER PUBLICATIONS

"GaN Electroluminescent Diodes," by J. I. Pankove et al., RCA Review, Vol. 32, Sept. 1971, pages 383–392.

"Monolithic Led with Localized Emission," by V. R. Bird et al., IBM Tech. Disclosure Bulletin, Vol. 13, No. 6, Nov. 1970, page 1600.

"Preparation of Mg-Doped GaN Diodes. . .," by H. P. Maruska et al., Mat. Res. Bull., Vol. 7, No. 8, Pages 777–781, (1972).

*Primary Examiner*—Palmer C. Demeo

*Attorney, Agent, or Firm*—Glenn H. Bruestle; Donald S. Cohen

[57] ABSTRACT

One surface of a transparent substrate is coated with a layer of an optically transparent, electrically conductive material, such as conductive gallium nitride. A body of insulating gallium nitride is disposed on the electrically conductive layer, and metal electrodes are provided on the insulating gallium nitride layer in a desired display pattern. A voltage bias applied between the electrically conductive layer and one or more of the metal electrodes generates light within the insulating gallium nitride body. The light replicates the shape of the electrode or electrodes which are biased and can be seen through the substrate.

4 Claims, 6 Drawing Figures

PATENTED FEB 4 1975

3,864,592

ELECTROLUMINESCENT SEMICONDUCTOR DISPLAY

BACKGROUND OF THE INVENTION

The present invention relates to an electroluminescent semiconductor device display, and more particularly to such a display formed on a single body of gallium nitride.

Recently there has come gallium aluminum arsenide, having demand miniaturized luminescent displays, particularly alphanumeric type displays, for use on clocks, watches, electronic calculators and the like. One type of display being used utilizes electroluminescent semiconductor devices, generally referred to as light emitting diodes or LED's. Such LED's generally comprise a body of single crystalline semiconductor material, such as gallium phosphide, gallium arsenide phosphide or galliuim aluminum arsendie, having regions of opposite conductivity forming a PN junction between the regions. Metal film electrodes are coated on a portion of each of said regions to permit a voltage to be applied across the PN junction. When the LED is biased, light is generated in the body adjacent the PN junction. The light is emitted from the LED where the PN junction intersects a surface of the LED and/or from an uncovered surface of the LED.

The LED's are generally made into displays by mounting a plurality of the LED's which are in the form of bars and/or dots, on a substrate in the desired pattern, such as segmented block 8 for a numeric display. Terminal wires are connected to the regions of each of the LED's to permit biasing the individual LED's. This type of LED display is complicated in structure and difficult to assemble because of the number of small LED's required and the wiring needed for the LED's.

Another type of LED display includes a body of the semiconductor material of one conductivity type having therein at one surface thereof a plurality of spaced diffused regions of the opposite conductivity type. The diffused regions form PN junctions with the body which junctions extend to the surface of the body. The diffused regions are shaped and arranged to form the desired display pattern. Metal film electrodes are coated on each of the diffused regions and on the surface of the body around the diffused regions. This type of display is also difficult to make because of the need to form the detailed diffused regions. Both of the above described LED displays also have the disadvantage of limited light emission since the light is emitted from either only along the PN junctions or from the surface area not coated with the electrodes since the electrodes block the emission of some of the light.

SUMMARY OF THE INVENTION

A semiconductor electroluminescent display including a body of insulating gallium nitride having opposed surfaces. A layer of an optically transparent, electrically conductive material is on one of the surfaces of the body, and a plurality of electrically conductive electrodes are on the other surface of the body. The electrodes are arranged in a desired display pattern.

DETAILED DESCRIPTION

Figures 1, 2, 3:
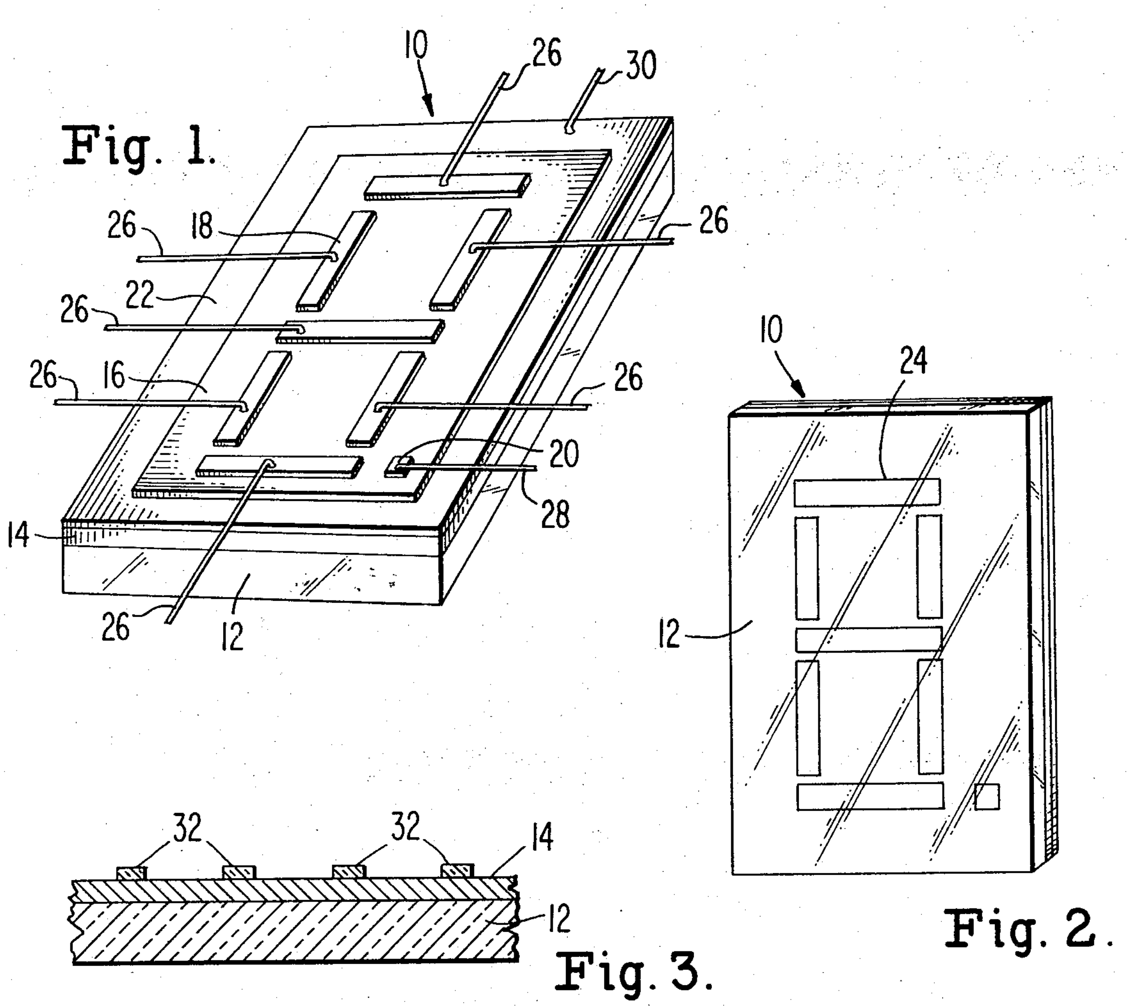
FIG. 1 is a perspective view of one form of the semiconductor electroluminescent display of the present invention.
FIG. 2 is a perspective view of the front surface of the semiconductor electroluminescent display showing the luminescent areas of the display.
FIGS. 3 through 6 are sectional views showing the various steps of making the semiconductor electroluminescent display of the present invention.

Referring initially to FIG. 1, a form of the semiconductor electroluminescent display of the present invention is generally designated as 10. The semiconductor electroluminescent display 10 comprises a flat substrate 12 of an electrical insulating and optically transparent material, such as sapphire. On a surface of the substrate 12 is a layer 14 of an electrically conductive, 83 16. optically transparent material which is preferably electrically conductive crystalline gallium nitride. On the surface of the electrically conductive gallium nitride layer 14 is a body 16 of insulating crystalline gallium nitride. Preferably, the insulating gallium nitride body 16 is smaller in area than the area of the surface of the electrically conductive gallium nitride layer 14. As shown, the electrically conductive gallium nitride layer 14 extends beyond the entire periphery of the insulating gallium nitride body 16.

On the surface of the insulating gallium nitride body 16 are a plurality of metal film electrodes 18 which are arranged in a desired display pattern. As shown, the metal film electrodes 18 are arranged in the form of a block 8 to provide a numeric display. An additional metal film electrode 20 is provided on the surface of the insulating gallium nitride body 16 adjacent the bottom of the block 8 to serve as a decimal point. A metal film contact 22 is coated on the surface of the electrically conductive gallium nitride layer 14 which projects beyond the periphery of the insulating gallium nitride body 16. The electrodes 18 and 20 and the contact layer 22 may be of any metal which makes good ohmic contact with the gallium nitride, such as indium or a layer of chromium covered with a layer of nickel.

In the use of the semiconductor electroluminescent display 10, terminal wires 26, 28 and 30 are attached to each of the electrodes 18 and 20 and to the contact 22, respectively. The contact 22 is connected through its terminal wire 30 to one side of a source of electrical energy, such as a battery or a pulse generator. If a source of DC voltage, such as a battery, is used, each of the electrodes 18 and 20 is connected through its respective terminal wire 26 and 28 and suitable switching to the other side of the DC voltage source. When a suitable DC voltage is applied between the contact 22 and one or more of the electrodes 18 and 20, light is emitted by the insulating gallium nitride body 16 which can be seen through the substrate 12 and the electrically conductive gallium nitride layer 14. The light will take the shape of the electrode 18 or 20 which is being biased. Thus, as shown in FIG. 2, if all of the electrodes 18 and 20 are simultaneously biased, the light seen through the substrate 12 will be in the form of the areas 24 to form a block 8 and a decimal point. By applying the bias to different ones of the electrodes 18, the light seen through the substrate 12 will be of different forms so that various numbers can be displayed by the semiconductor electroluminescent display 10. Other configurations of the electrodes 18 can be used to generate letters as well as numbers in an alphanumeric display.

To make the semiconductor electroluminescent display 10, a surface of a large wafer 12 of electrically insulating, optically transparent material is coated with a layer 14 of optically transparent electrically conductive gallium nitride, as shown in FIG. 3. The electrically conductive gallium nitride layer 14 is epitaxially deposited on the wafer 12 such as by the vapor phase epitaxy technique described in the article "The Preparation And Properties Of Vapor-Deposited Single-Crystalline GaN," by H. P. Maruska and J. J. Tietjen, published in APPLIED PHYSICS LETTERS, Vol. 15, page 327 (1969). A gallium nitride layer so deposited will inherently be of high conductive N type conductivity because of native uncontrolled donors, such as nitrogen vacancies, which are inherently formed in the material. The electrically conductive gallium nitride layer 14 is then coated with a masking layer, such as silicon oxide or tungsten, which will act as a mask against further epitaxial growth of gallium nitride. Spaced areas of the masking layer are then removed to leave masking strips 32 on the conductive gallium nitride layer 14 as shown in FIG. 3. This can be achieved by coating the area of the masking layer which is to form the masking strips with a resist material using a standard photolithographic technique. The uncoated areas of the masking layer can then be removed by etching.

Figure 4:
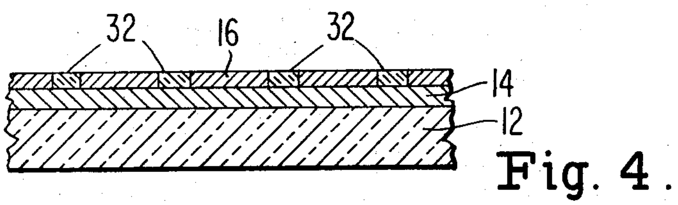

The electrical insulating gallium nitride bodies 16 are then desposited on the areas of the electrically conductive gallium nitride layer 14 between the masking strips 32, as shown in FIG. 4. The insulating gallium nitride bodies 16 are epitaxially deposited in the same manner as previously described for the electrically conductive gallium nitride layer 14. However, in the deposition of the insulating gallium nitride bodies 16, an acceptor impurity, such as zinc, beryllium, magnesium, or lithium, is included in the bodies. A sufficient amount of the acceptor impurity is introduced into the gallium nitride bodies 16 to compensate substantially all of the native donors inherently formed in the gallium nitride, so that the gallium nitride bodies 16 are insulating. The masking strips 32 are then removed with a suitable etchant to expose a portion of the surface of the electrically conductive gallium nitride layer 14 around each of the insulating gallium nitride bodies 16.

Figure 5:
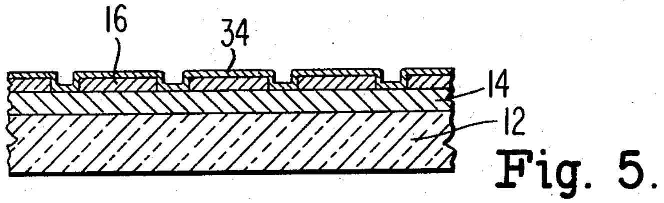
Figure 6:
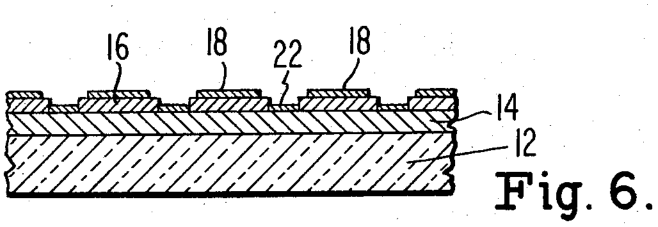

As shown in FIG. 5, a metal film is then coated over the surfaces of the insulating gallium nitride bodies 16 and the exposed areas of the conductive gallium nitride layer 14. The metal film 34 is of the metal or combination of metals desired for the electrodes 18 and 20 and the contact 22. The metal film 34 is then selectively etched to form the electrodes 18 and 20 and the contact 22. This may be achieved by applying a resist coating over the areas of the metal film 34 which are to form the contacts 22 and the electrodes 18 and 20 using standard photolithographic techniques. The uncovered portions of the metal film 34 are then removed, such as with a suitable etchant. This provides the electrodes 18 and 20 on the insulating gallium nitride bodies 16 and the contacts 22 on the surface of the conductive gallium nitride layer 14 around the insulating gallium nitride bodies 16, as shown in FIG. 6.

The individual semiconductor electroluminescent displays 10 may be then separated by cutting through the insulating wafer 12, conductive gallium nitride layer 14, and contacts 22 along lines between the insulating gallium nitride bodies 16. The semiconductor electroluminescent displays 10 may be cut apart by any suitable cutting technique, such as with a laser. However, if a display is desired which has more than one set of display patterns, the wafer 26 may be cut so that each piece includes two or more of the insulating gallium nitride bodies 16. Also, after the terminal wires are attached to the various electrodes 18 and the contact 22, a protection layer of a suitable insulating material, such as a plastic, may be coated over the electrodes, contact, and insulating gallium nitride body. In addition, the terminal wires can be attached simultaneously to all of the electrodes and the contact by using a metallic preform containing all of the terminals attached to a frame. After the terminals are attached, they are then cut from the frame.

Thus, there is provided by the present invention an electroluminescent semiconductor display which utilizes a single body of the semiconductor material, i.e., the insulating gallium nitride body, with the display pattern being formed by the metal film electrodes coated on the semiconductor body. In the electroluminescent semiconductor display of the present invention, the illuminated display is visible through the surface of the semiconductor body opposite to that on which the electrodes are coated. Thus, the electrodes do not interfere with the emission of the light from the semiconductor body so as to provide a relatively bright display. Also, the electroluminescent semiconductor display is relatively simple to manufacture since the display pattern is defined by the shape and arrangement of the electrodes which are relatively easy to design by standard photolighographic techniques. In addition, the electroluminescent semiconductor display of the present invention can be made as an alphanumeric display having a plurality of individual indicia on a single substrate as an integrated device.

I claim:

1. A semiconductor electroluminescent display comprising:

a substrate of an electrically insulating, optically transparent material, a layer of optically transparent, conductive gallium nitride on a surface of said substrate, a continuous body of insulating gallium nitride on a surface of said conductive gallium nitride layer, said body being of an area smaller than the area of the surface of said conductive gallium nitride layer so that a portion of the surface of said conductive gallium nitride layer is not covered by said body, a metal contact on the uncovered surface of said conductive gallium nitride layer, and a plurality of electrically conductive electrodes on the surface of said body away from the conductive gallium nitride layer, with said electrodes being arranged in a desired display pattern.

2. A semiconductor electroluminescent display in accordance with claim 1 in which the substrate is of sapphire, the conductive gallium nitride layer is an epitaxial layer on the substrate, and the insulating gallium nitride body is an epitaxial layer on the conductive gallium nitride layer.

3. A semiconductor electroluminescent display in accordance with claim 2 in which said conductive gallium nitride body projects beyond the periphery of said insulating gallium nitride body.

4. A semiconductor electroluminescent display in accordance with claim 3 in which the metal contact is a film on the surface of said conductive gallium nitride layer which projects beyond the periphery of said insulating gallium nitride body.

* * * * *

UNITED STATES PATENT OFFICE
CERTIFICATE OF CORRECTION

PATENT NO. : 3,864,592

DATED : February 4, 1975

INVENTOR(S) : Jacques Isaac Pankove

It is certified that error appears in the above-identified patent and that said Letters Patent are hereby corrected as shown below:

In the specification

| | | |
|---|---|---|
| Column 1, | Line 9 | insert "into" after "come" |
| | | delete "gallium aluminum arsenide having" |
| | 18 | change "arsendie" to --arsenide-- |
| | 19 | insert "type" after "conductivity" |
| | 30 | insert "a" before "segmented" |
| Column 2, | Line 16 | delete "83 16" |
| Column 3, | Line 45 | insert "34" after "film". |

Signed and sealed this 20th day of May 1975.

(SEAL)
Attest:

RUTH C. MASON
Attesting Officer

C. MARSHALL DANN
Commissioner of Patents
and Trademarks